(12) United States Patent
Kopta et al.

(10) Patent No.: US 8,461,622 B2
(45) Date of Patent: Jun. 11, 2013

(54) REVERSE-CONDUCTING SEMICONDUCTOR DEVICE

(75) Inventors: Arnost Kopta, Zürich (CH); Munaf Rahimo, Uezwil (CH)

(73) Assignee: ABB Technology AG, Zurich (CH)

( * ) Notice: Subject to any disclaimer, the term of this patent is extended or adjusted under 35 U.S.C. 154(b) by 10 days.

(21) Appl. No.: 13/098,827

(22) Filed: May 2, 2011

(65) Prior Publication Data

US 2011/0204414 A1 Aug. 25, 2011

Related U.S. Application Data

(63) Continuation of application No. PCT/EP2009/064626, filed on Nov. 4, 2009.

(30) Foreign Application Priority Data

Nov. 5, 2008 (EP) .................................. 08168332

(51) Int. Cl.
*H01L 29/66* (2006.01)
(52) U.S. Cl.
USPC .................... 257/140; 257/143; 257/E29.197
(58) Field of Classification Search
USPC ................. 257/133, 139, 273, 378, E21.384, 257/E21.383, E29.197, 577, 186, 199; 438/328, 438/170, 189, 197, 202–205, 234, 309, 312, 438/322, 340
See application file for complete search history.

(56) References Cited

U.S. PATENT DOCUMENTS

| 5,171,696 A | 12/1992 | Hagino |
| 5,583,285 A | 12/1996 | Hahn et al. |

(Continued)

FOREIGN PATENT DOCUMENTS

| DE | 10 2005 019 178 A1 | 11/2006 |
| DE | 10 2006 050 338 A1 | 4/2008 |

(Continued)

OTHER PUBLICATIONS

European Search Report issued on May 26, 2009, for European Application No. 08168332.8.

(Continued)

*Primary Examiner* — Fernando L Toledo
*Assistant Examiner* — Aaron Gray
(74) *Attorney, Agent, or Firm* — Buchanan Ingersoll & Rooney PC

(57) ABSTRACT

A reverse-conducting semiconductor device includes a free-wheeling diode and an insulated gate bipolar transistor (IGBT) on a common wafer. Part of the wafer forms a base layer with a base layer thickness. The IGBT includes a collector side and an emitter side arranged on opposite sides of the wafer. A first layer of a first conductivity type and a second layer of a second conductivity type are alternately arranged on the collector side. The first layer includes at least one first region with a first region width and at least one first pilot region with a first pilot region width. The second layer includes at least one second region with a second region width and at least one second pilot region with a second pilot region width. Each second region width is equal to or larger than the base layer thickness, whereas each first region width is smaller than the base layer thickness. Each second pilot region width is larger than each first pilot region width. Each first pilot region width is equal to or larger than two times the base layer thickness, and the sum of the areas of the second pilot regions is larger than the sum of the areas of the first pilot regions.

25 Claims, 5 Drawing Sheets

U.S. PATENT DOCUMENTS

| | | | |
|---|---|---|---|
| 5,654,554 A | 8/1997 | Feller et al. | |
| 6,259,123 B1 | 7/2001 | Kelberlau et al. | |
| 6,452,261 B1 * | 9/2002 | Kodama et al. | 257/688 |
| 7,112,868 B2 * | 9/2006 | Willmeroth et al. | 257/578 |
| 2004/0144992 A1 | 7/2004 | Willmeroth et al. | |
| 2005/0017290 A1 | 1/2005 | Takahashi et al. | |
| 2008/0093623 A1 | 4/2008 | Kono | |
| 2008/0135871 A1 | 6/2008 | Ruething et al. | |
| 2011/0204414 A1 * | 8/2011 | Kopta et al. | 257/140 |

FOREIGN PATENT DOCUMENTS

| | | |
|---|---|---|
| EP | 0683530 A2 | 11/1995 |
| EP | 0715162 A1 | 6/1996 |
| EP | 0715165 A1 | 6/1996 |

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) dated May 31, 2012, issued in corresponding International Application No. PCT/EP2009/064626. (8 pages).

Baliga, "Power Semiconductor Devices", PWS Publishing Company, (1995), Chapter 8, XP002634709, pp. 426-502 (includes pp. 430-431).

* cited by examiner

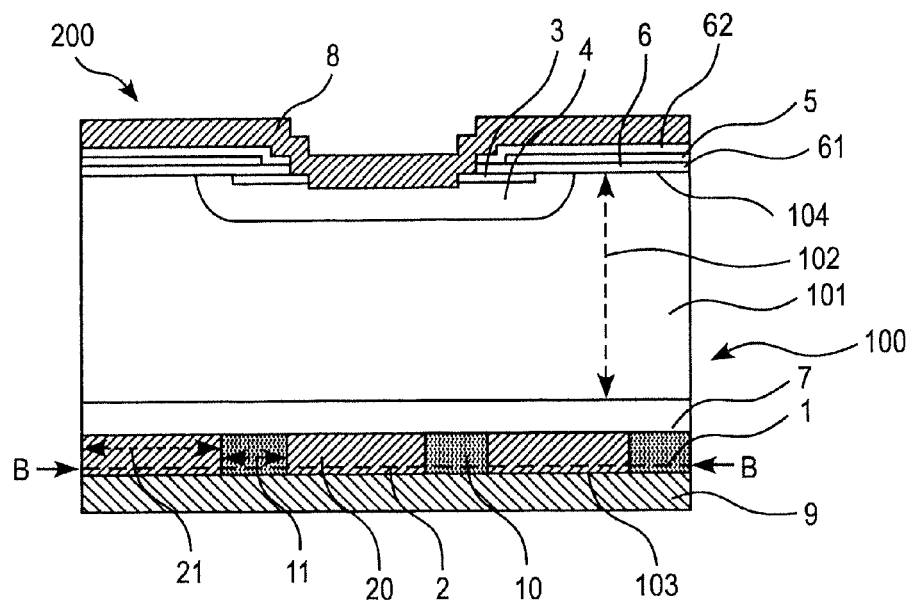
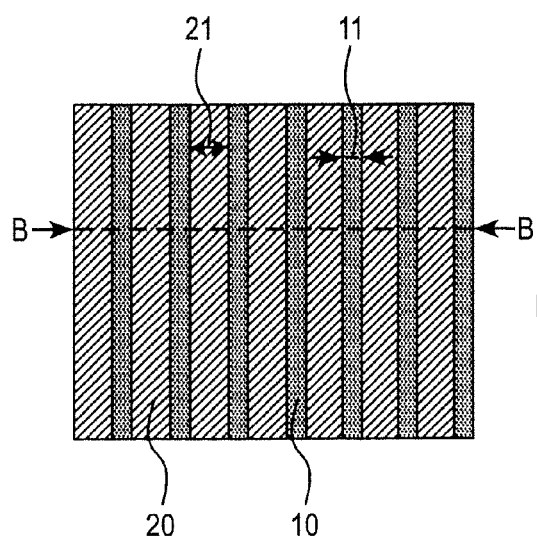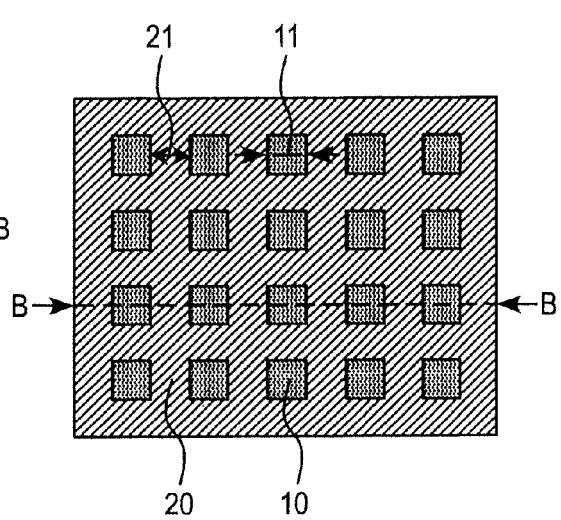
FIG. 3
FIG. 4
FIG. 5

US 8,461,622 B2

REVERSE-CONDUCTING SEMICONDUCTOR DEVICE

RELATED APPLICATION

This application claims priority as a continuation application under 35 U.S.C. §120 to PCT/EP2009/064626, which was filed as an International Application on Nov. 4, 2009 designating the U.S., and which claims priority to European Application 08168332.8 filed in Europe on Nov. 5, 2008. The entire contents of these applications are hereby incorporated by reference in their entireties.

FIELD

The present disclosure relates to the field of power electronics. More particularly, the present disclosure relates to a reverse-conducting semiconductor device and to a converter with such a reverse-conducting semiconductor device.

BACKGROUND INFORMATION

FIG. 1 illustrates a reverse-conducting semiconductor device 200' as disclosed in U.S. 2008/0135871 A1. The reverse-conducting semiconductor device 200' as shown in FIG. 1 is a reverse-conducting insulated gate bipolar transistor (RC-IGBT), which includes, within one wafer 100, an insulated gate bipolar transistor with a built-in freewheeling diode. As shown in FIG. 1, such a reverse-conducting semiconductor device 200' includes an n type base layer 101 with a first main side, which is the emitter side 104 of the integrated IGBT, and a second main side, which is the collector side 103 of the IGBT and which lies opposite the emitter side 104. A fourth p type layer 4 is arranged on the emitter side 104. Third n type layers 3 with a higher doping than the base layer 101 are arranged on the fourth layer 4.

A sixth electrically insulating layer 6 is arranged on the emitter side 104 and covers the fourth layer 4 and the base layer 101. The sixth layer 6 also partially covers the third layer 3. An electrically conductive fifth layer 5 is completely embedded in the sixth layer 6. No portion of the third or sixth layer 3, 6 is arranged above the central part of the fourth layer 4.

On this central part of the fourth layer 4, a first electrical contact 8 is arranged, which also covers the sixth layer 6. The first electrical contact 8 is in direct electrical contact with the third layer 3 and the fourth layer 4, but is electrically insulated from the fifth layer 5.

On the second main side, a seventh layer 7 formed as a buffer layer is arranged on the base layer 101. On the seventh layer 7, n type first layers 1 and p type second layers 2 are arranged alternately in a plane. The first layers 1 as well as the seventh layer 7 have a higher doping than the base layer 101.

A second electrical contact 9 is arranged on the collector side 103 and it covers the first and second layers 1, 2 and is in direct electrical contact with them.

In such a reverse-conducting semiconductor device 200', a freewheeling diode is formed between the second electrical contact 9, part of which forms a cathode electrode in the diode, the n type first layer 1, which forms a cathode region in the diode, the base layer 101, part of which forms the diode base layer, the p type fourth layer 4, part of which forms an anode region in the diode, and the first electrical contact 8, which forms an anode in the diode.

An insulated gate bipolar transistor (IGBT) is formed between the second electrical contact 9, part of which forms the collector electrode in the IGBT, the p type second layer 2, which forms a collector region in the IGBT, the base layer 101, part of which forms the IGBT base layer, the fourth layer 4, part of which forms a p-base region in the IGBT, the third layer 3, which forms a n type source region in the IGBT, and the first electrical contact 8, which forms an emitter electrode. During the on-state of the IGBT, a channel is formed between the emitter electrode, the source region and the p-base region towards the n-base layer.

The n type first layer 1 includes a plurality of third regions 15 with a third region width 16. The p type second layer 2 includes a plurality of fourth region 25 with a fourth region width 26. The second layer 2 forms a continuous layer, in which each third region 15 is surrounded by the continuous second layer 2.

FIG. 2 illustrates the first and second layer 1, 2 over the whole wafer area through a cut along the line A-A from FIG. 1. This line is also indicated in FIG. 2 in order to show that the RC-IGBT 200' does not have the same structure for the first and second layer 1, 2 over the whole plane of the wafer 100. In the upper part of the drawing (see line A-A), the structure of regularly arranged third regions 15 and fourth regions 25 is shown.

In the lower part of FIG. 2, it is shown that the second layer 2 further includes a fifth region 27 (surrounded by a dashed line in the drawing), which has a larger fifth region width 28, which is larger than the width 26 of any fourth region 25. The width 28 of a fifth region 27 plus the width 16 of a third region 15 is 1.5 to 5 times larger than the width 26 of a fourth region 25 plus the width 16 of a third region 15.

Such a structure is used in order to get large p doped areas for improvement of the on-state properties of the semiconductor device and by having areas, in which the p doped regions in form of fourth regions 25 are small compared to the fifth regions 27, the distance between the third regions 15 in the areas, in which third regions 15 are present, can be kept small. Thereby, the device can be used for higher currents.

However, due to the usage of third regions 15, each of which is surrounded by fourth regions 25, the possibilities to achieve good diode properties of the RC-IGBT are limited, because the area of the n type first layer 1, which is responsible for the diode properties, is small due to the geometrical conditions of such a device as known from US 2008/0135871 A1. If, for example, the width 16 of the third regions 15 is made as large as that of the fourth regions 25, the total n doped area is already not more than 25% of the whole area. By additionally introducing a larger p area as p doped fifth regions 27, the total n doped area is further reduced. If, on the other hand, the width 16 of the third regions 15 was enlarged as compared to the fourth regions 25, the IGBT properties would be worsened in an unacceptable manner, because snap back effects could occur.

US 2005/017290, EP 0683 30 and US 2008/093623 show known reverse conducting IGBTs with alternating n and p doped regions on the collector side of the devices. EP 0683530 discloses that the total area of the p doped regions is larger than the total area of the n doped regions.

SUMMARY

An exemplary embodiment of the present disclosure provides a reverse-conducting semiconductor device which includes a wafer, a freewheeling diode arranged on the wafer, and an insulated gate bipolar transistor arranged on the wafer. Part of the wafer which has an un-amended doping in the finalized reverse-conducting semiconductor device forms a base layer. The insulated gate bipolar transistor includes a collector side and an emitter side. The collector side is arranged opposite of the emitter side of the wafer. The base layer has a base layer thickness, which is defined as the maximum thickness which the base layer has between the collector side and the emitter side. A first layer of a first conductivity type and a second layer of a second conductivity type are arranged alternately on the collector side. The first layer includes at least one first region, wherein each first region is surrounded by a first region border and has a first region width and at least one at least one first pilot region, and each first pilot region is surrounded by a first pilot region border and has a first pilot region width. The second layer includes at least one second region and at least one second pilot region, wherein each second region is surrounded by a second region border and has a second region width, and each second pilot region is surrounded by a second pilot region border and has a second pilot region width. Each region or layer width is defined as two times the maximum value of a shortest distance between any point within the region or layer and a point on the region or layer border. The second layer has a different structure across the entirety of the second layer. Each first region width is smaller than the base layer thickness. Each second region width is equal to or larger than the base layer thickness. Each first pilot region width is equal to or larger than the base layer thickness. Each second pilot region width is larger than two times the base layer thickness. Each second pilot region width is larger than each first pilot region width. The sum of the areas of the at least one second pilot region is larger than the sum of the areas of the at least one first pilot region.

BRIEF DESCRIPTION OF THE DRAWINGS

Additional refinements, advantages and features of the present disclosure are described in more detail below with reference to exemplary embodiments illustrated in the drawings, in which:

FIG. 3 shows a cross sectional view of a reverse-conducting IGBT according to an exemplary embodiment of the present disclosure;

FIG. 4 shows a plan view of the structures of first and second regions of a reverse-conducting IGBT according to an exemplary embodiment of the present disclosure;

FIG. 5 shows a plan view of the structures of first and second regions of a reverse-conducting IGBT according to an exemplary embodiment of the present disclosure;

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
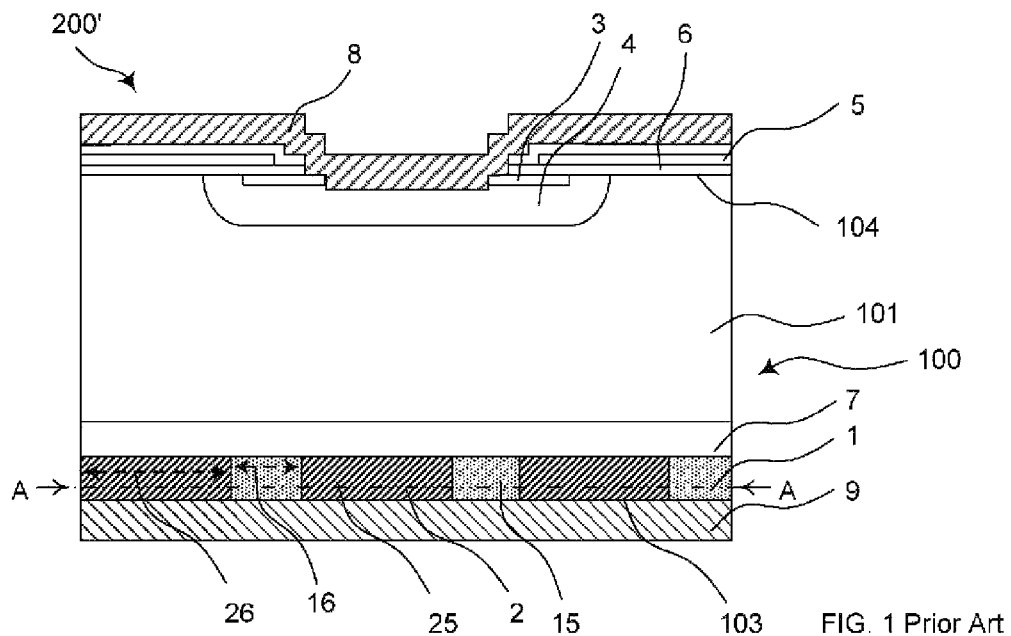
FIG. 1 shows a cross sectional view of a known reverse-conducting IGBT.
Figure 2:
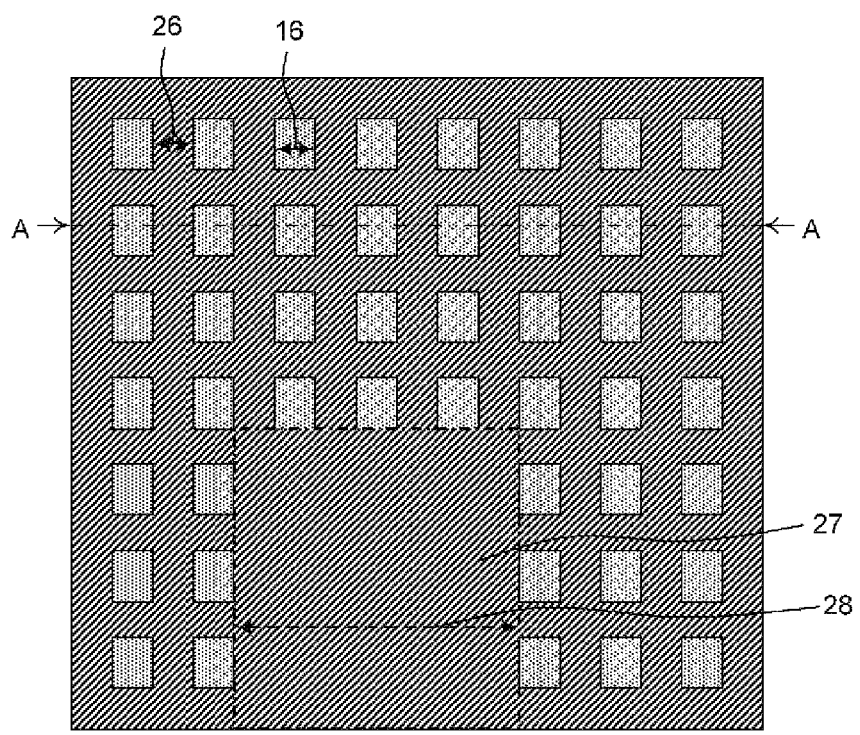
FIG. 2 shows a plan view of the structures of first and second layers of a known RC-IGBT.

Exemplary embodiments of the present disclosure provide a reverse-conducting semiconductor device with improved diode performance without sacrificing the IGBT performance.

An exemplary embodiment of the present disclosure provides a reverse-conducting insulated gate bipolar transistor (RC-IGBT) which includes a freewheeling diode and an insulated gate bipolar transistor (IGBT) on a common wafer, where part of the wafer forms a base layer with a base layer thickness. The insulated gate bipolar transistor includes a collector side and an emitter side, whereas the collector side is arranged opposite of the emitter side of the wafer. The base layer thickness is defined as the maximum thickness, which the base layer has between the collector side and the emitter side.

A first layer of a first conductivity type, e.g. n-type, and a second layer of a second conductivity type, e.g. p-type, are alternately arranged on the collector side. The first layer includes at least one first region and at least one first pilot region. Each first region is surrounded by a first region border and has a first region width, and each first pilot region is surrounded by a first pilot region border and has a first pilot region width. The second layer includes at least one second region and at least one second pilot region. Each second region is surrounded by a second region border and has a second region width, and each second pilot region is surrounded by a second pilot region border and has a second pilot region width. According to an exemplary embodiment, the following geometrical rules are fulfilled:

- the second layer does not have the same structure over the whole plane,
- each first region width is smaller than the base layer thickness,
- each second region width is equal to or larger than the base layer thickness,
- each first pilot region width is equal to or larger than the base layer thickness,
- each second pilot region width is larger than two times the base layer thickness,
- each second pilot region width is larger than each first pilot region width, and
- the sum of the areas of the at least one second pilot region is larger than the sum of the areas of the at least one first pilot region.

According to an exemplary embodiment, each region or layer width is defined as two times the maximum value of a shortest distance, which exists between any point within the region or layer and a point on the region or layer border. The maximum value is the longest distance to completely charge or discharge the region if the device is switched between on/off or vice versa.

The conditions ensure that small first regions are present as compared to the second regions so that the IGBT area is kept large and snap back effects, which occur at large first diode regions, are avoided.

Since the small first and second regions do not heavily influence the IGBT mode in line with the above design rule, their dimensions are adjusted to achieve the required diode area.

By the introduction of separate second pilot regions with much increased dimensions as compared to the first and second regions, regions are created which are either dedicated as IGBT regions or diode regions not operating in the opposite mode.

By introducing only a few of the first pilot regions and second pilot regions as compared to the first regions and second regions, large areas of the device with shorted structures (first and second regions) are maintained.

To avoid sacrificing too much IGBT area, the p-type second pilot regions as pilot regions ensure increased IGBT area while at the same time first pilot regions as pilot n-type regions ensure a reasonably large diode area.

The first and second regions form the main shorted region in which the silicon area included is utilized in both the IGBT and diode mode. These regions also influence the main IGBT electrical properties. The first pilot regions and second pilot regions are mainly present to give more freedom to determine the IGBT to diode area ratio and decouple this design aspect from the standard approach involving the small first regions and large first pilot regions only.

If first pilot regions are introduced, larger dimensions can be chosen for the second regions which will result in two positive features: firstly, the elimination of snap-back during the on-state characteristics of the IGBT; and secondly, softer turn-off performance for both the IGBT and diode.

FIG. 3 illustrates an exemplary embodiment of a reverse-conducting semiconductor device 200, also named reverse-conducting insulated gate bipolar transistor (RC-IGBT). The RC-IGBT 200 includes a low doped n type base layer 101 with a first main side, which forms the emitter side 104 of the integrated IGBT, and a second main side opposite the first main side, which forms the collector side 103 of the integrated IGBT. The base layer 101 is that part of a wafer 100 which has an un-amended doping in the finalized reverse-conducting insulated gate bipolar transistor. The base layer 101 has a base layer thickness 102, which is defined as the maximum thickness, which the base layer 101 has between the collector side 103 and the emitter side 104. In FIG. 3, the base layer thickness is the distance between the emitter side 104 (e.g., the sixth layer 6, which is introduced in the paragraph below) and the seventh layer 7. In case the RC-IGBT does not have a seventh layer 7, the base layer thickness is the distance between the emitter side 104 (e.g., the sixth layer 6) and the first or second layer 1, 2.

A p type fourth layer 4 is arranged on the emitter side 104. At least one n type third layer 3 is also arranged on the emitter side 104 and it is surrounded by the fourth layer 4. The at least one third layer 3 has a higher doping than the base layer 101. A sixth electrically insulating layer 6 is arranged on the emitter side 104 on top of the base layer 101, the fourth and third layer 4, 3. The sixth layer 6 at least partially covers the at least one third layer 3, the fourth layer 4 and the base layer 101. An electrically conductive fifth layer 5 is arranged on the emitter side 104 electrically insulated from the at least one fourth layer 4, the third layer 3 and the base layer 101 by the sixth layer 6. According to an exemplary embodiment, the fifth layer 5 is embedded in the sixth layer 6.

According to an exemplary embodiment, the sixth layer 6 includes a first electrically insulating layer 61, which can be made of a silicon dioxide, for example, and a second electrically insulating layer 62, which can also be made of a silicon dioxide. According to an exemplary embodiment, the second insulating layer 62 can be made of the same material as the first electrically insulating layer 61. The second electrically insulating layer 62 covers the first electrically insulating layer 61. For an RC-IGBT 200 with a fifth layer 5 formed as a planar gate electrode as shown in FIG. 3, the first electrically insulating layer 61 is arranged on top of the emitter side 104. The fifth layer 5, which forms a gate electrode, is embedded between the first and second electrically insulating layers 61, 62, which form the sixth layer 6. According to an exemplary embodiment, the fifth layer 5 can be completely embedded between the first and second insulating layers 61, 62. Thus, the fifth layer 5 is separated from the base layer 101, the fourth and third layers 4, 3 by the first electrically insulated layer 61. The fifth layer 5 can be made of a heavily doped polysilicon or a metal like aluminum, for example.

The at least one third layer 3, the fifth layer 5 and the sixth layer 6 are formed in such a way that an opening is created above the fourth layer 4. The opening is surrounded by the at least one third layer 3, the fifth layer 5 and the sixth layer 6.

A first electrical contact 8 is arranged on the emitter side 104 within the opening so that it is in direct electrical contact with the fourth layer 4 and the third layer 3. According to an exemplary embodiment, the first electrical contact 8 can also cover the sixth layer 6, but it is separated and thus electrically insulated from the fifth layer 5 by the second electrically insulating layer 62.

An n type first layer 1 and a p type second layer 2 are arranged on the collector side 103. The first layer 1 has a higher doping than the base layer 101. The first and second layers 1, 2 can be arranged in the same plane or, alternatively, they can also be arranged in different planes, whereas the planes from the first and second layer 1, 2 are spaced from each other at least by the thickness of that layer, which is arranged farer away from the collector side 103. Devices with such first and second layers 1, 2 being arranged in different planes and their manufacturing methods are known from EP 07150162 and EP 07150165.

A second electrical contact 9 is arranged on the collector side 103 and is in direct electrical contact with the at least one first and second layers 1, 2. According to an exemplary embodiment, Ti, Ni, Au and/or Al can be used as a material for the second electrical contact 9.

In the exemplary RC-IGBT 200, a diode is formed between the first electrical contact 8, which forms an anode electrode in the diode, the fourth layer 4, part of which forms an anode layer, the base layer 101, part of which forms a base layer for the diode, the n type first layer 1, which layer forms a cathode layer, and the second electrical contact 9, which forms a cathode electrode.

In the exemplary RC-IGBT 200, an insulated gate bipolar transistor (IGBT) is formed between the first electrical contact 8, which forms an emitter electrode in the IGBT, the third layer 3, which forms a source region, the fourth layer 4, part of which forms a channel region, the base layer 101, part of which forms a base region for the IGBT, the p type second layer 2, which forms a collector layer, and the second electrical contact 9, part of which forms a collector electrode.

Figure 9:
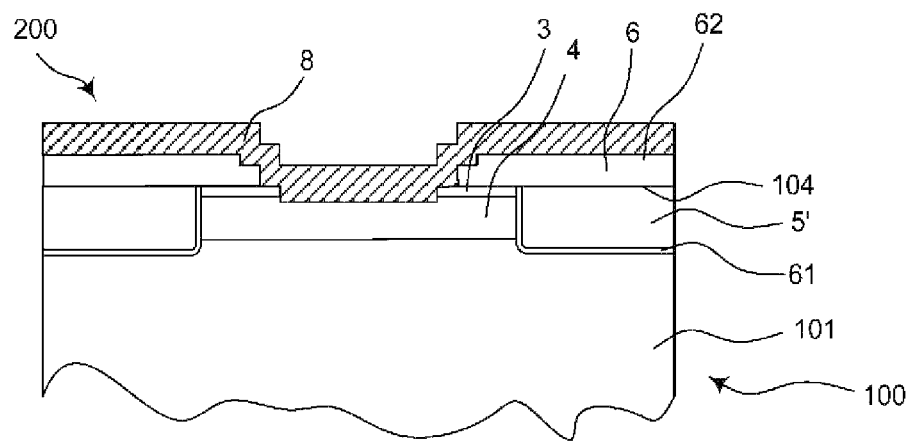
FIG. 9 shows the layers on the emitter side of a reverse-conducting IGBT with trench gate electrodes according to an exemplary embodiment of the present disclosure.

According to another exemplary embodiment, the RC-IGBT can be provided with a planar gate electrode, in which case the RC-IGBT may include a fifth layer 5', formed as trench gate electrode as shown in FIG. 9. The trench gate electrode is arranged in the same plane as the fourth layer 4 and adjacent to the third layer 3, separated from each other by a first insulating layer 61, which also separates the fifth layer 5' from the base layer 101. A second insulating layer 62 is arranged on top of the fifth layer 5' formed as a trench gate electrode, thus insulating the fifth layer 5' from the first electrical contact 8.

The n type first layer 1 includes at least one first region 10 and at least one first pilot region 12, wherein each first region 10 has a first region width 11 and a first region border, which surrounds the first region 10, and each first pilot region 12 has a first pilot region width 13 and a first pilot region border, which surrounds the first pilot region 12. According to an exemplary embodiment, the first layer 1 includes a plurality of first regions 10 and/or first pilot regions 12.

The p type second layer 2 includes at least one second region 20 and at least one second pilot region 22, wherein each second region 20 has a second region width 21 and a second region border, which surrounds the second region 20, and each second pilot region 22 has a second pilot region width 23 and a second pilot region border, which surrounds the second pilot region 22. According to an exemplary embodiment, the second layer 2 includes a plurality of second regions 20 and/or second pilot regions 22.

The first regions 10 and second regions 20 form shorted regions. Each second region width 21 is equal to or larger than the base layer thickness 102, and each first region width 11 is smaller than the base layer thickness 102.

FIG. 4 shows a cut through of the first and second layers 1, 2 along the line B-B from FIG. 3. This line is also indicated in FIG. 4 in order to show that the exemplary RC-IGBT does not have the same structure for the first and second layer 1, 2 over the whole plane of the wafer 100. For example, there are parts in which the first and second layer 1, 2 only includes first and second regions 10, 20 as shown in FIGS. 4 and 5 and which are also present in the FIGS. 6, 7 and 8, e.g. along the line B-B. In other parts of the RC-IGBT 200, the first and second layer 1, 2 include second pilot regions 22 and first pilot regions 12. According to an exemplary embodiment, the width 23 of each second pilot region 22 is larger than each first pilot region width 13. Each second pilot region width is equal to or larger than two times the base layer thickness 102. Each first pilot region width 13 is equal to or larger than the base layer thickness 102. Furthermore, the total area of the second pilot regions 22 is larger than the total area of the first pilot regions 12. The total area of the first pilot regions is the sum of the areas of all single first pilot regions. The total area of any other region is correspondingly the sum of the areas of all such single regions. For example, if there is only one first pilot region in a device, the total area of the first pilot region is the area of the region. If there is a plurality of such first pilot regions in a device, the total area is the sum of these first pilot regions.

In accordance with another exemplary embodiment, the sum of the areas of the second regions and second pilot regions 20, 22 to the wafer area is between 70% up to 90%. In such a device, the sum of the areas of the first regions 10 and first pilot regions 12 to wafer area is between 10% up to 30%.

In accordance with an exemplary embodiment, the sum of the areas of the second pilot regions 22 to the wafer area is between 10% to 30%.

The widths 11, 21 of the shorted first and/or second regions 10, 20 can be constant over the whole wafer area so that the first and second regions 10, 20 are arranged in a regular geometrical manner over the wafer 100, but their widths may also vary over the wafer 100.

According to an exemplary embodiment, designs for the first and second regions 10, 20 are a stripe design (as shown in FIG. 4) or a design, in which each first region 10 is surrounded by a second region 20 (as shown in FIG. 5). In such a design, the first regions 10 may be in exemplary embodiments of a square, rectangular or circular shape.

Figure 6:
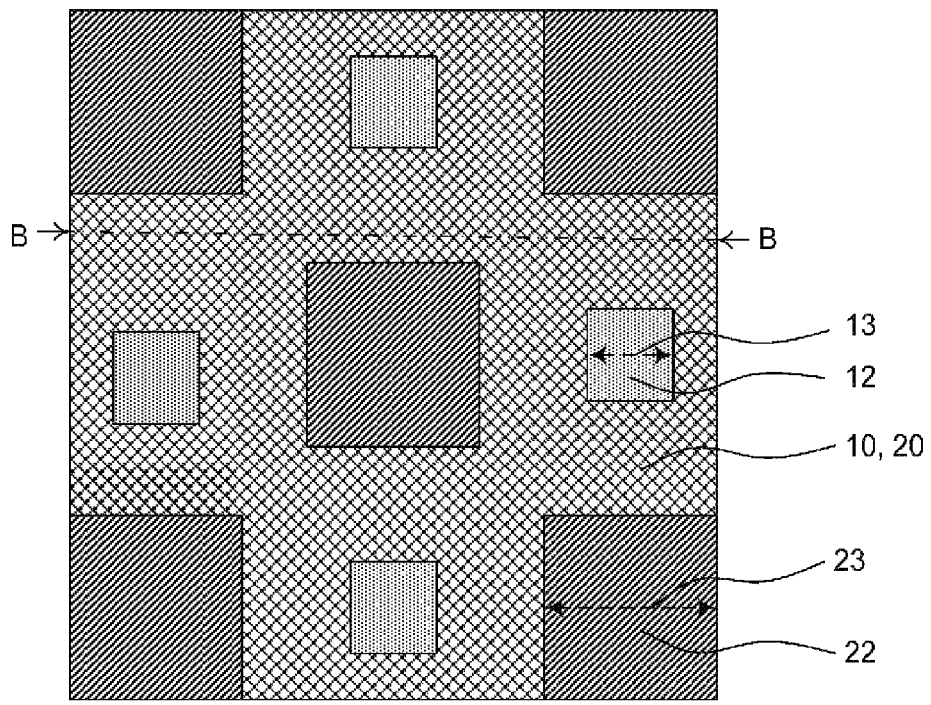
FIGS. 6 to 8 show a plan view of the structures of a first layer with first regions and first pilot regions, and a second layer with second regions and second pilot regions of reverse-conducting IGBTs according to an exemplary embodiment of the present disclosure.
Figure 7:
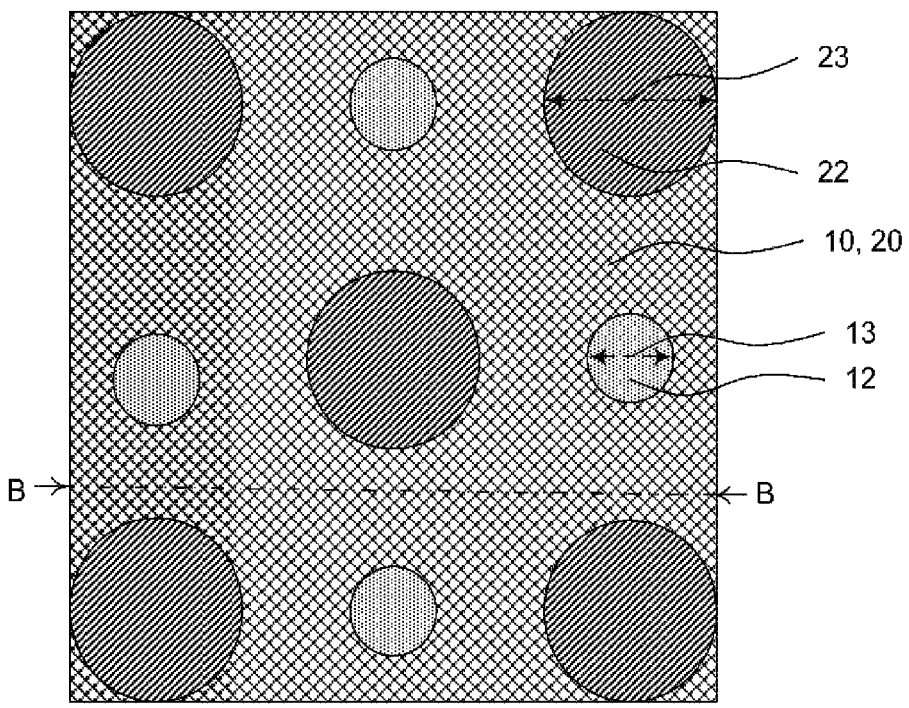

In accordance with an exemplary embodiment, the first pilot regions 12 and/or second pilot regions 22 have a square, rectangular, cross or circular shape. FIG. 6 shows such first pilot regions 12 and second pilot regions 22 with a square shape, whereas FIG. 7 shows first pilot regions 12 and second pilot regions 22 with a circular shape. In FIGS. 6 and 7, each first pilot region 12 is isolated from a second pilot region 22 by intermediate lying first and/or second regions 10, 20. Alternatively, at least one first pilot region 12 may also be attached to a second pilot region 22.

The pilot region width in case of the pilot region 12, 22 having the form of a square (e.g., FIG. 6) corresponds to the width of the square. The maximum value of a shortest distance between any point within the pilot region and a point on the pilot region border is for a square design the distance between the central point of the square to the middle point of any of the border lines. This is the longest distance to equalize charge during switching of the device.

For a circular shape of the pilot regions 12, 22 as shown in FIG. 7, the pilot region width corresponds to the diameter of the pilot region (again, the maximum value is present from the central point of the circle to any point on the border of the circular pilot region).

Figure 8:
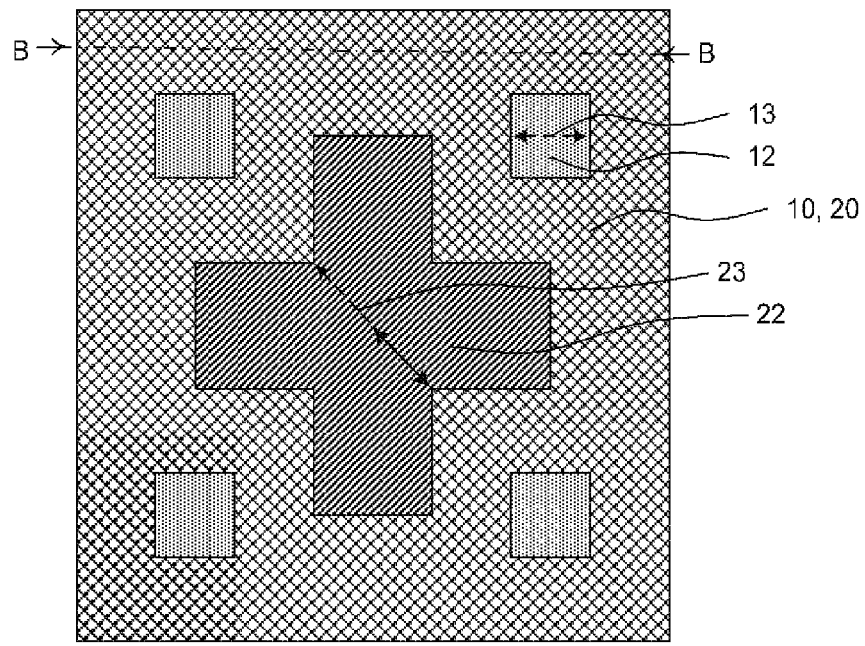

FIG. 8 shows an exemplary embodiment of the second pilot region 22 in the form of a cross. For explaining what the maximum value 24 of the shortest distance is for this case, the cross is hypothetically divided into four outer rectangles and a central rectangle. The maximum value 24 of a shortest distance between any point within the cross region to the border of the cross region exists from the middle point of the central rectangle of the cross to one of the four points, on which two adjacent outer rectangles adjoin (see continuous line in FIG. 8). The second pilot region width 23, which is two times this maximum value, is shown as a dashed line. This is the longest way an electron or hole has to flow in order to charge or discharge the region if the device is switched between on/off or vice versa.

In FIGS. 6 to 8, the first and second regions 10, 20 are only indicated by hatching of the area designated with 10, 20 for clarity reasons, but the hatched area is meant to be an area of alternating first and second regions 10, 20, for example, as shown in FIGS. 4 and 5.

As also shown in FIG. 3, in accordance with an exemplary embodiment, the RC-IGBT 10 may also include an n type seventh layer 7, which is arranged between the base layer 101 and the first and second layer 1, 2 respectively, and which seventh layer 7 has a higher doping than the base layer 101.

Figure 10:
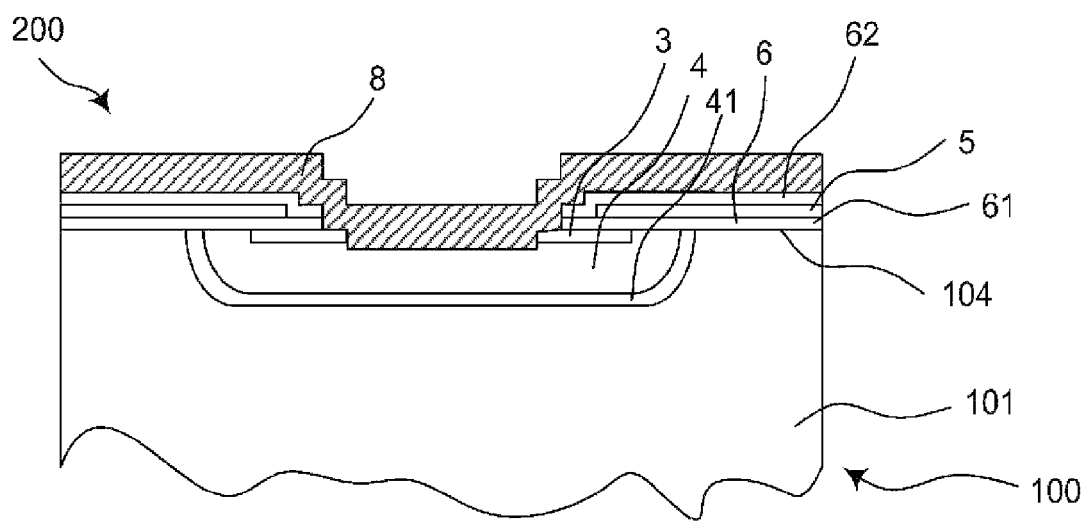
FIG. 10 shows the layers on the emitter side of a reverse-conducting IGBT with an enhancement layer according to an exemplary embodiment of the present disclosure.

In accordance with an exemplary embodiment as shown in FIG. 10, an eighth n doped layer 41, formed as an enhancement layer, is arranged between the fourth layer 4 and the base layer 101 for having lower on-state losses. The eighth layer 41 separates the fourth layer 4 from the base layer 101 and it has higher doping than the base layer 101.

In accordance with an exemplary embodiment, the conductivity types of the layers are switched, e.g., all layers of the first conductivity type are p type (e.g. the base layer 101) and all layers of the second conductivity type are n type (e.g. the fourth layer 4).

The reverse-conducting semiconductor device 200 according to the above-described exemplary embodiments can be used in a converter, for example.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 first layer
10 first region
11 width of first region
12 first pilot region 13 first pilot region width
15 third region
16 width of third region
2 second layer
20 second region
21 width of second region
22 second pilot region
23 second pilot region width
24 maximum value of shortest distance between any point within a region to a point on its border
25 fourth region
26 width of fourth region
27 fifth region
28 width of fifth region
3 third layer
4 fourth layer
41 eighth layer
5, 5' fifth layer
6 sixth layer
61 first electrically insulating layer
62 second electrically insulating layer
7 seventh layer
8 first electrical contact
9 second electrical contact
100 wafer
101 base layer
102 base layer thickness
103 collector side
104 emitter side
200, 200' RC-IGBT

What is claimed is:

1. A reverse-conducting semiconductor device comprising:
   a wafer;
   a freewheeling diode arranged on the wafer; and
   an insulated gate bipolar transistor arranged on the wafer, wherein:
   part of the wafer which has an un-amended doping in the finalized reverse-conducting semiconductor device forms a base layer;
   the insulated gate bipolar transistor comprises a collector side and an emitter side, the collector side being arranged opposite of the emitter side of the wafer;
   the base layer has a base layer thickness, which is defined as the maximum thickness which the base layer has between the collector side and the emitter side;
   a first layer of a first conductivity type and a second layer of a second conductivity type, which is different from the first conductivity type, are arranged alternately on the collector side;
   the first layer comprises at least one first region, wherein each first region is surrounded by a first region border, which constitutes an interface between the corresponding first region and the second layer or a portion of the first layer not including the corresponding first region, and has a first region width,
   the first layer comprises at least one first pilot region, wherein each first pilot region is surrounded by a first pilot region border, which constitutes an interface between the corresponding first pilot region and the second layer of a portion of the first layer not including the corresponding first pilot region and the at least one first region, and has a first pilot region width;
   the second layer comprises at least one second region, wherein each second region is surrounded by a second region border, which constitutes an interface between the corresponding second region and a second layer or a portion of the second layer not including the corresponding second region, and has a second region width,
   the second layer comprises at least one second pilot region, wherein each second pilot region is surrounded by a second pilot region border, which constitutes an interface between the corresponding second pilot region and the first layer or a portion of the second layer not including the corresponding second pilot region, and has a second pilot region width;
   each region or layer width is defined as two times the maximum value of a shortest distance between any point within the region or layer and a point on the region or layer border;
   the second layer has a non-uniform structure across the entirety of the second layer;
   each first region width is smaller than the base layer thickness;
   each second region width is equal to or larger than the base layer thickness;
   each first pilot region width is equal to or larger than the base layer thickness;
   each second pilot region width is larger than two times the base layer thickness;
   each second pilot region width is larger than each first pilot region width; and
   the sum of the areas of the at least one second pilot region is larger than the sum of the areas of the at least one first pilot region.

2. The reverse-conducting semiconductor device according to claim 1, wherein the widths of at least one of the first and second regions vary over the wafer.

3. The reverse-conducting semiconductor device according to claim 1, wherein the widths of at least one of the first and second regions are constant over the wafer.

4. The reverse-conducting semiconductor device according to claim 1, wherein at least one of the first and second regions are arranged as stripes over the wafer.

5. The reverse-conducting semiconductor device according to claim 1, wherein each first region is completely surrounded by a corresponding one of the at least one second region.

6. The reverse-conducting semiconductor device according to claim 5, wherein the at least one first region has one of a square, rectangular and circular shape.

7. The reverse-conducting semiconductor device according to claim 1, wherein each first pilot region is isolated from any second pilot region by at least one of the first and second regions.

8. The reverse-conducting semiconductor device according to claim 1, wherein at least one first pilot region is attached to a second pilot region.

9. The reverse-conducting semiconductor device according to claim 1, wherein at least one of the second pilot region and the first pilot region has one of a square, rectangular, cross and circular shape.

10. The reverse-conducting semiconductor device according to claim 1, wherein the sum of the areas of the at least one second regions and the at least one second pilot regions to an area of the wafer is between 70% up to 90%.

11. The reverse-conducting semiconductor device according to claim 1, wherein the sum of the areas of the at least one first region and the at least one first pilot region to an area of the wafer is between 10% up to 30%.

12. The reverse-conducting semiconductor device according to claim 1, wherein the sum of the areas of the at least one second pilot regions to an area of the wafer is between 10% to 30%.

13. A converter comprising a reverse-conducting semiconductor device according to claim 1.

14. The reverse-conducting semiconductor device according to claim 3, wherein at least one of the first and second regions are arranged as stripes over the wafer.

15. The reverse-conducting semiconductor device according to claim 3, wherein each first region is completely surrounded by a corresponding one of the at least one second region.

16. The reverse-conducting semiconductor device according to claim 15, wherein the at least one first region has one of a square, rectangular and circular shape.

17. The reverse-conducting semiconductor device according to claim 15, wherein each first pilot region is isolated from any second pilot region by at least one of the first and second regions.

18. The reverse-conducting semiconductor device according to claim 15, wherein at least one first pilot region is attached to a second pilot region.

19. The reverse-conducting semiconductor device according to claim 7, wherein at least one of the second pilot region and the first pilot region has one of a square, rectangular, cross and circular shape.

20. The reverse-conducting semiconductor device according to claim 7, wherein the sum of the areas of the at least one second regions and the at least one second pilot regions to an area of the wafer is between 70% up to 90%.

21. The reverse-conducting semiconductor device according to claim 7, wherein the sum of the areas of the at least one first region and the at least one first pilot region to an area of the wafer is between 10% up to 30%.

22. The reverse-conducting semiconductor device according to claim 7, wherein the sum of the areas of the at least one second pilot regions to an area of the wafer is between 10% to 30%.

23. A converter comprising a reverse-conducting semiconductor device according to claim 7.

24. The reverse-conducting semiconductor device according to claim 1, wherein the first conductivity type is n type, and the second conductivity type is p type.

25. The reverse-conducting semiconductor device according to claim 1, wherein the first conductivity type is p type, and the second conductivity type is n type.

* * * * *